(12) United States Patent
Onodera et al.

(10) Patent No.: US 7,811,408 B2
(45) Date of Patent: Oct. 12, 2010

(54) METAL-CLAD LAMINATE AND METHOD FOR PRODUCTION THEREOF

(75) Inventors: Minoru Onodera, Kurashiki (JP); Tadao Yoshikawa, Kurashiki (JP)

(73) Assignee: Kuraray Co., Ltd., Kurashiki-shi (JP)

( * ) Notice: Subject to any disclaimer, the term of this patent is extended or adjusted under 35 U.S.C. 154(b) by 593 days.

(21) Appl. No.: 11/718,843

(22) PCT Filed: Oct. 27, 2005

(86) PCT No.: PCT/JP2005/019781

§ 371 (c)(1),
(2), (4) Date: May 8, 2007

(87) PCT Pub. No.: WO2006/051693

PCT Pub. Date: May 18, 2006

(65) Prior Publication Data

US 2008/0107833 A1    May 8, 2008

(30) Foreign Application Priority Data

Nov. 10, 2004  (JP)  ............................. 2004-326086

(51) Int. Cl.
B32B 37/00    (2006.01)
B29C 65/00    (2006.01)
(52) U.S. Cl. ...................... 156/308.2; 156/324; 264/345
(58) Field of Classification Search ............... 156/308.2, 156/309.6, 324; 264/345, 346
See application file for complete search history.

(56) References Cited

U.S. PATENT DOCUMENTS

| | | | |
|---|---|---|---|
| 5,529,740 A | 6/1996 | Jester et al. | |
| 5,703,202 A | 12/1997 | Jester et al. | |
| 6,274,242 B1 * | 8/2001 | Onodera et al. | .......... 428/411.1 |
| 6,616,796 B1 * | 9/2003 | Onodera et al. | .......... 156/309.6 |
| 2005/0067739 A1 | 3/2005 | Onodera et al. | |

FOREIGN PATENT DOCUMENTS

| | | |
|---|---|---|
| EP | 0 507 332 | 10/1992 |
| JP | 05 042603 | 2/1993 |
| JP | 08 090570 | 4/1996 |
| JP | 2000 343610 | 12/2000 |

* cited by examiner

*Primary Examiner*—John L Goff
(74) *Attorney, Agent, or Firm*—Oblon, Spivak, McClelland, Maier & Neustadt, L.L.P.

(57) ABSTRACT

A metal-clad laminate excellent in isotropy, appearance, bondability between a TLC polymer film and a metallic sheet, and dimensional stability is provided less costly with a first step of thermally compressing the film with the metallic sheet by passing them through a nipping region between heating rolls, and a second step of heat-treating the resultant metal-clad laminate at a temperature not higher than the melting point of the film, wherein the film has thermal expansion coefficient $\alpha_L$ satisfying $\alpha_L = \beta T + \gamma$ with thickness T, thickness coefficient $\beta$ and anisotropy coefficient $\gamma$ of the film; wherein the coefficient $\beta$ is within the range of $-0.08$ to $-0.01$; the coefficient $\gamma$ is within the range of $\alpha_M + 6 \leq \gamma \leq \alpha_M + 10$ with thermal expansion coefficient $\alpha_M$ of the metallic sheet; and thermal expansion coefficient $\alpha_T$ of the film is within $\alpha_M - 2 \leq \alpha_T \leq \alpha_M + 3$ with the coefficient $\alpha_M$.

4 Claims, 2 Drawing Sheets

METAL-CLAD LAMINATE AND METHOD FOR PRODUCTION THEREOF

FIELD OF THE INVENTION

The present invention relates to a metal-clad laminate having a film (which film is hereinafter referred to as a thermoplastic liquid crystal polymer film) including a thermoplastic polymer capable of forming an optically anisotropic melt phase (which thermoplastic polymer is hereinafter referred to as a thermoplastic liquid crystal polymer), and a method for producing such metal-clad laminate. More specifically, the metal laminate obtained in accordance with the present invention has not only excellent properties such as low moisture absorbability, heat resistance, chemical resistance and electrical properties deriving from the thermoplastic liquid crystal polymer film, but also excellent dimensional stability and is useful as materials for a flexible electric wiring board and for a circuit board on which semiconductor devices is mounted.

BACKGROUND ART

In recent years, demands for scale reduction and weight reduction of portable electronic devices such as mobile communication devices have come to be pressing, and high density mounting has come to be increasingly expected. In accordance with the demands, use has been made of multi-layered wiring boards, reduced wiring pitches, fine via holes, and small-size multiple-pin IC packages and, along therewith, the scale reduction and surface mounting of passive elements such as capacitors and resistors are taking place. In particular, as an effective approach, there have been mentioned techniques of forming those passive elements directly on a surface of and/or inside the printed wiring board or the like and techniques of directly mounting active elements such as IC packages on a surface of the printed wiring board, and these techniques are effective not only to achieve a high density mounting, but to increase the reliability. As a result, requirements for the dimensional stability of the wiring boards have come to be highly developed that is the stable rate of change in dimension before and after formation of semiconductor circuits as well as before and after the heating process used to mount the active and/or passive elements has been required. In addition, the necessity to eliminate the anisotropy of the wiring boards has come to be increasing.

The thermoplastic liquid crystal polymer film having excellent properties such as low moisture absorbability, heat resistance, chemical resistance and electrical properties has been rapidly commercialized as a material for an insulation substrate which improves reliability of printed wiring boards.

Hitherto, manufacture of a metal-clad laminate by laminating a thermoplastic liquid crystal polymer film and a metallic sheet together has been carried out by the utilization of a vacuum hot press apparatus. This lamination is conducted by a process in which while the thermoplastic liquid crystal polymer film and the metallic sheet are placed in between two hot plates, the both are thermally compressed to bond them together under a vacuum atmosphere, and this process is called as a vacuum hot press lamination process. In order to obtain the metal-clad laminate excellent in dimensional stability, with this lamination method, the coefficients of longitudinal and transverse thermal expansion of the thermoplastic liquid crystal polymer film used as a raw material must be adjusted to a value approximating to the thermal expansion coefficient of the metallic sheet and by so doing, the anisotropy in dimensional stability can be eliminated. However, since the vacuum hot press lamination process is a sheet-feed type manufacturing process, a large length of time such as material setting time, press work time for one cycle, and time required to remove the material after the press work is necessary to complete production of one metal-clad laminate, and the production rate is therefore lowered. If an attempt is made to improve the machine and equipments so that a number of products can be manufactured all at a time with the production rate increased, the machine and equipments tend to become bulky in size and costly, resulting in increase of the cost. Accordingly, development of a continuous manufacturing method capable of alleviating the foregoing problems has hitherto been desired for.

On the other hand, in order to provide the full features of the thermoplastic liquid crystal polymer film and, further, to bring out the superiority thereof in terms of cost, continuous lamination with the metallic sheet has to be embodied and this has hitherto been deliberated in various fields. By way of example, conditions necessary to improve the adhesive force between the polymer film and the metallic sheet and a technique for improving the mechanical strength (See, for example, the JP laid-open Patent Publication No. H05-42603.) have been well known in the art. The method of treating a thermoplastic liquid crystal polymer film, particularly a technology concerning the rate of change in dimension upon heating of the thermoplastic liquid crystal polymer film (See, for example, the JP Laid-open Patent Publication No. H08-90570.) has also been well known in the art.

DISCLOSURE OF THE INVENTION

However, the JP Laid-open Patent Publication No. H05-42603 is silent as to the manner of improving the dimensional stability of the thermoplastic liquid crystal polymer film and, similarly, the JP Laid-open Patent Publication No. H08-90570 is also silent as to the characteristics of the metal-clad laminate. In addition, with the techniques disclosed in each of those prior art patent documents, it is difficult to obtain continuously and in a stabilized fashion, the metal-clad laminate excellent in isotropy and dimensional stability. In other words, in the case where the thermoplastic liquid crystal polymer film and the metallic sheet are thermally compressed to bond them together at a nipping region between the heating rolls, molecules of the thermoplastic liquid crystal polymer film are apt to be oriented in the longitudinal direction by at least the effect of the tension brought about by the weight of the film itself in a direction longitudinally thereof (in a pulling direction) in a free run region defined by a material feed apparatus and the heating rolls, and by the pressure imposed on the film in a direction longitudinally thereof at the nipping region between the heating rolls. As a result thereof, it is difficult to provide the metal-clad laminate excellent in isotropy and dimensional stability.

An object of the present invention is to provide a metal-clad laminate, and a method for production thereof, which is effective to provide a metal-clad laminate excellent in isotropy, appearance, adhesive force between the polymer film and the metallic sheet, and dimensional stability with high productivity by the use of a continuous manufacturing technique using the heating rolls.

In order to accomplish the foregoing objects of the present invention, there is provided a method of producing a metal-clad laminate of a kind including a thermoplastic liquid crystal polymer film and a metallic sheet bonded to at least one surface of the film, which method includes a first step of thermally compressing the metallic sheet and the thermoplastic liquid crystal polymer film at a nipping region between heating rolls to bond them together to provide a metal-clad laminate, wherein a coefficient $\alpha_L$ ($\times 10^{-6}$ cm/cm/° C.) of thermal expansion in the longitudinal direction, a thickness T (μm), a thickness coefficient $\beta$ ($\times 1/(\mu m \times °$ C.)) and an anisotropy coefficient $\gamma$ ($\times 10^{-6}$ cm/m/° C.) of the thermoplastic liquid crystal polymer film satisfy the equation, $\alpha_L = \beta T + \gamma$, and wherein the thickness coefficient $\beta$ is within the range of −0.08 to −0.01, that is, ($-0.08 \leq \beta \leq -0.01$), the anisotropy coefficient $\gamma$ relative to a thermal expansion coefficient ($\alpha_M$) of the metallic sheet is within the range of +6 to +10 ($\times 10^{-6}$ cm/cm/° C.), that is, ($\alpha_M + 6 \leq \gamma \leq \alpha_M + 10$), and a coefficient $\alpha_T$ of thermal expansion in the transverse direction of the polymer film relative to the thermal expansion coefficient $\alpha_M$ of the metallic sheet is within the range of −2 to +3 ($\times 10^{-6}$ cm/cm/° C.), that is, ($\alpha_M - 2 \leq \alpha_T \leq \alpha_M + 3$); and a second step of heat treating the resultant metal-clad laminate at a heat treating temperature equal to or lower than the melting point of the thermoplastic liquid crystal polymer film.

As hereinabove described, when the stretched thermoplastic liquid crystal polymer film and the metallic sheet are thermally compressed to bond them together as they are passed through the nipping region between the heating rolls, anisotropy in the longitudinal thermal expansion is developed in the thermoplastic liquid crystal polymer film by the effect of the tension acting on those materials in the longitudinal direction of the film, and the pressure imposed on the film in the longitudinal direction thereof by the heating rolls. According to the present invention, by the use of the thermoplastic liquid crystal polymer film having the thermal expansion coefficients $\alpha_L$ and $\alpha_T$ of the film in the lengthwise (longitudinal) direction and the widthwise (transverse) direction falling within the specified ranges, respectively, during the first step when the thermoplastic liquid crystal polymer film and the metallic sheet are thermally compressed as they pass through the nipping region between the heating rolls while a tension is applied continuously to the film in the longitudinal direction thereof, such anisotropy can be counterbalanced by the molecular orientation of the thermoplastic liquid crystal polymer film, tending to orient the molecules in a direction transverse to the longitudinal direction of the film, thereby eliminating the anisotropy of the thermal expansion coefficient of the thermoplastic liquid crystal polymer film. As a result, the metal-clad laminate excellent in isotropy and appearance can be obtained stably. Also, when a heat treatment is performed on the resultant metal-clad laminate under a specific temperature condition, the strong bondability between the polymer film and the metallic sheet is achieved to provide the metal-clad laminate excellent in dimensional stability having a desired rate of dimensional change. In this way, the metal-clad laminate excellent in isotropy, appearance, bondability between the polymer film and the metallic sheet, and dimensional stability can be obtained with a high productivity resulting from the continuous manufacture with the use of the heating rolls.

Although raw materials of the thermoplastic liquid crystal polymer to be used in the present invention is not specifically limited, specific examples of such thermoplastic liquid crystal polymer may include well-known thermotropic liquid crystal polyesters and thermotropic liquid crystal polyester amides, which can be prepared from compounds and the derivatives thereof, classified into the following exemplified compounds (1) to (4). It is, however, to be noted that in order to obtain a polymer capable of forming an optically anisotropic melt phase, various combination of those raw compounds has nevertheless their own proper mixing ranges.

(1) Aromatic or aliphatic dihydroxy compounds. (As for typical examples, see Table 1 below.)

TABLE 1

Chemical formulae of typical examples of aromatic or aliphatic dihydroxy compounds

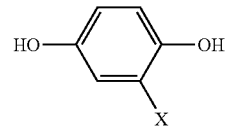

(X is hydrogen or a halogen, or a group such as a lower alkyl or phenyl)

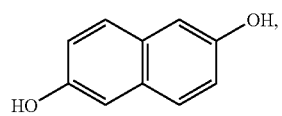

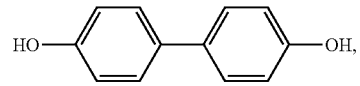

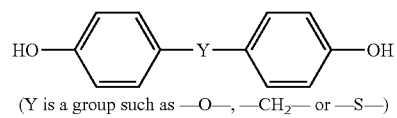

(Y is a group such as —O—, —CH$_2$— or —S—)

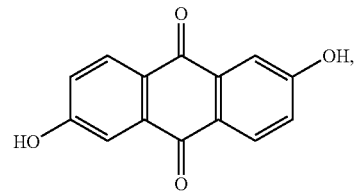

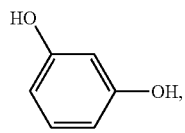

HO(CH$_2$)$_n$OH
(n is an integer of 2 to 12)

(2) Aromatic or aliphatic dicarboxylic acids. (As for typical examples, see Table 2 below.)

TABLE 2

Chemical formulae of typical examples of aromatic or aliphatic dicarboxylic acids

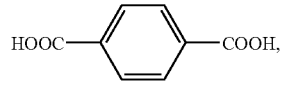

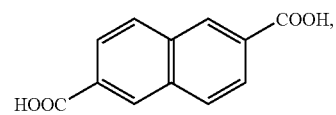

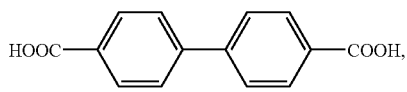

TABLE 2-continued

Chemical formulae of typical examples of
aromatic or aliphatic dicarboxylic acids

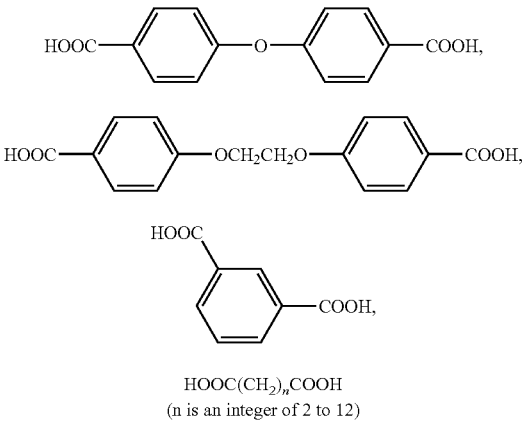

HOOC(CH$_2$)$_n$COOH
(n is an integer of 2 to 12)

(3) Aromatic hydroxycarboxylic acids. (As for typical examples, see Table 3 below.)

TABLE 3

Chemical formulae of typical examples of
aromatic hydroxycarboxylic acids

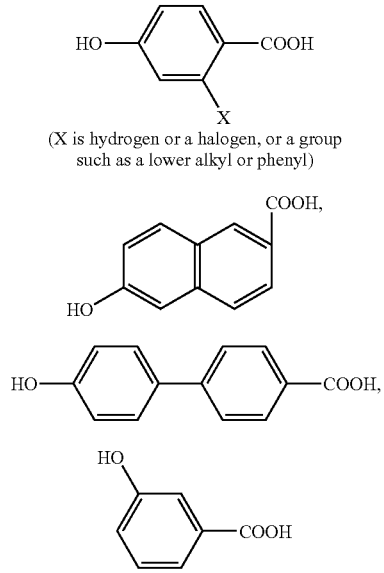

(X is hydrogen or a halogen, or a group
such as a lower alkyl or phenyl)

(4) Aromatic diamines, aromatic hydroxyamines or aromatic aminocarboxylic acids. (As for typical examples, see Table 4 below.)

TABLE 4

Chemical formulae of typical examples of aromatic
diamines, aromatic hydroxyamines or aromatic aminocarboxylic acids

TABLE 4-continued

Chemical formulae of typical examples of aromatic
diamines, aromatic hydroxyamines or aromatic aminocarboxylic acids

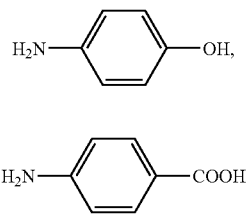

Typical examples of the thermoplastic liquid crystal polymer obtained from these compounds include copolymers (a) to (e) having structural units shown in Table 5.

TABLE 5

Typical examples of thermoplastic liquid crystal polymer (a)

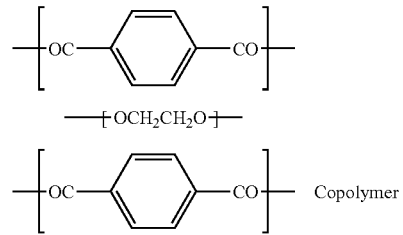

(b)

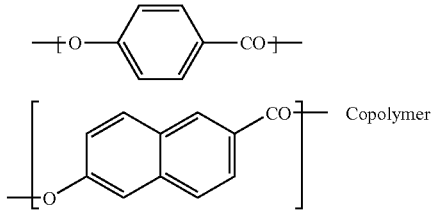

(c)

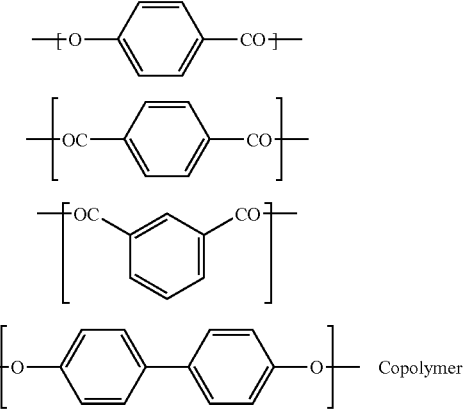

TABLE 5-continued

Typical examples of thermoplastic liquid crystal polymer (d) [chemical structure: naphthalene dicarboxylate, terephthalate, and aminophenol ether units] — Copolymer (e) [chemical structure: hydroxybenzoate, terephthalate, biphenyl diether, and diphenyl-Y diether units] — Copolymer (Y is a group such as —O—, —CH$_2$— or —S—)

In addition, the thermoplastic liquid crystal polymer to be used in the present invention preferably has a melting point within the range of from about 200 to about 400° C., more preferably within the range of from about 250 to about 350° C. in order to render the resultant film to have a desirable heat resistance and a workability. In the case where the film requires a higher heat resistance and melting point, the heat resistance and melting point of the film can be increased to a desired degree if the resultant film once obtained is subjected to a heat treatment. As one example of the heat treatment, with the film once obtained, which has a melting point of 283° C., the melting point of the film can be increased to 320° C. if such film is heated at 260° C. for 5 hours.

The thermoplastic liquid crystal polymer film used in the present invention can be obtained by extrusion-molding of the above-mentioned thermoplastic liquid crystal polymer. At this time, although any extrusion molding methods can be employed, industrially advantageous one includes T-die film forming and stretching method, laminate stretching method, inflation method and the like. Particularly with the inflation method, stresses can be applied not only in a direction of the mechanical axis of the film (the longitudinal direction of the film referred to above) (which direction is hereinafter referred to as "MD direction"), but also in a direction perpendicular to the MD direction (the transverse direction of the film referred to above) (which direction is hereinafter referred to as "TD direction") and, therefore, it possible to obtain the film, of which mechanical properties and thermal characteristics in both of the MD direction and the TD direction are well counterbalanced with each other.

The thermoplastic liquid crystal polymer film referred to above is required to have a coefficient $\alpha_L$ ($\times 10^{-6}$ cm/cm/° C.) of thermal expansion in the longitudinal direction of the film, which coefficient in relation to a thickness T (μm), a thickness coefficient β ($\times 1/(\mu m \times ° C.)$) and an anisotropy coefficient γ ($\times 10^{-6}$ cm/cm/° C.) of the film, satisfies the equation, $\alpha_L = \beta T + \gamma$. At the same time, the thickness coefficient β, the anisotropy coefficient γ relative to a thermal expansion coefficient ($\alpha_M$) of the metallic sheet and a coefficient $\alpha_T$ of thermal expansion of the film in the transverse direction relative to the thermal expansion coefficient $\alpha_M$ of the metallic sheet must be within the range of $-0.08$ to $-0.01$, i.e., ($-0.08 \leq \beta \leq -0.01$), the range of $+6$ to $+10$ ($\times 10^{-6}$ cm/cm/° C.), i.e., ($\alpha_M + 6 \leq \gamma \leq \alpha_M + 10$), and the range of $-2$ to $+3$ ($\times 10^{-6}$ cm/cm/° C.), i.e., $\alpha_M - 2 \leq \alpha_T \leq \alpha_M + 3$), respectively. The required thermal expansion coefficient of the thermoplastic liquid crystal polymer film may vary, depending on fields of application, within the specific range discussed above. The thermoplastic liquid crystal polymer film having the thermal expansion coefficient within this specific range has a mechanical property and a thermal characteristic in both of the MD and TD directions, which are not balanced with each other. The thermoplastic liquid crystal polymer film, however, does not pose any practical problem and is, as will be discussed later, advantageous in improvement in isotropy, appearance, bondability between the polymer film and the metallic sheet, and dimensional stability when such film is eventually used to form the metal-clad laminate.

The thermal expansion coefficient of the film referred to above is defined as the coefficient obtained by dividing the degree of thermal expansion of such film by a temperature difference, when such film is heated from a room temperature to a temperature approximating to the thermal deformation temperature of the film at a predetermined temperature raising rate. This thermal expansion coefficient of the film can be calculated by the following manner.

First the known apparatus for thermomechanical analysis is employed, and a strip of film cut from the thermoplastic liquid crystal polymer film is fixed at one end of the apparatus and allowed to apply a tensile load at the opposite end thereof. Thereafter the amount of thermal expansion of the film strip, which is exhibited when the film strip is heated at a constant temperature raising rate, is measured. By way of example, assuming that the film strip has a length L0 (mm) as measured in a direction in which the tensile load is applied, and a length L1 (mm) as measured in a direction when heated, and that the room temperature and the heating temperature are expressed by T1 (° C.) and T2 (° C.), respectively, the thermal expansion coefficient can be calculated from the following equation:

$$\alpha_L = [(L1-L0)/(T2-T1)]/L0 (\times 10^{-6} \text{ cm/cm/° C.})$$

In the present invention, the parameters L0, T2 and T1 are chosen to be 20 mm, 150° C. and 25° C., respectively, and the tensile load is chosen to be 1 gr.

The coefficient $\alpha_L$ ($\times 10^{-6}$ cm/cm/° C.) of thermal expansion in the longitudinal (MD) direction of the film used in the practice of the present invention satisfies, in relation to the thickness T (μm), the thickness coefficient β ($\times 1/(\mu m \times ° C.)$) and the anisotropy coefficient γ ($\times 10^{-6}$ cm/cm/° C.) of such film, the equation of $\alpha_L = \beta T + \gamma$. This equation is designed with the thickness of the film taken into consideration with respect to the longitudinal thermal expansion coefficient $\alpha_L$.

The thickness coefficient β referred to above is required to be within the range of $-0.08$ to $-0.01$, that is, ($-0.08 \leq \beta \leq -0.01$). If the thickness coefficient β is greater than $-0.01$ or smaller than $-0.08$, the resultant metal-clad laminate will exhibit an unsatisfactory dimensional stability, and a considerable anisotropy will occur between the MD and TD directions. In particular, in the field of application where a high dimensional stability is required, the thickness coefficient β is preferred to be within the range of −0.07 to −0.02.

The anisotropy coefficient γ referred to above is required to be, relative to the thermal expansion coefficient $\alpha_M$ if the metallic sheet, within the range of +6 to +10 ($\times 10^{-6}$ cm/cm/° C.), that is ($\alpha_M+6 \leq \gamma \leq \alpha_M+10$). If the anisotropy coefficient γ is smaller than ($\alpha_M+6$) or greater than ($\alpha_M+10$), the resultant metal-clad laminate will exhibit an unsatisfactory dimensional stability and a considerable anisotropy will occur between the MD and TD directions. By way of example, in the case of the metallic sheet being a copper foil, since the copper foil has a thermal expansion coefficient of 18 ($\times 10^{-6}$ cm/cm/° C.), the anisotropy coefficient γ is within the range of 24 to 28. In the case of the metallic sheet being an aluminum foil, since the aluminum foil has a thermal expansion coefficient of 23 ($\times 10^{-6}$ cm/cm/° C.), the anisotropy coefficient γ is within the range of 29 to 33.

The coefficient $\alpha_T$ of thermal expansion of the film in the widthwise (TD) direction is required to be within the range of −2 to +3 ($\times 10^{-6}$ cm/cm/° C.) relative to the thermal expansion coefficient $\alpha_M$ of the metallic sheet, that is, $\alpha_M-2 \leq \alpha_T \leq \alpha_M+3$. By way of example, in the case of the metallic sheet being a copper foil, the thermal expansion coefficient $\alpha_T$ is within the range of 16 to 21. In the case of the metallic sheet being an aluminum foil, the thermal expansion coefficient $\alpha_T$ is within the range of 21 to 26. The thermal expansion coefficient $\alpha_T$ referred to above is preferably within the range of $\alpha_M \leq \alpha_T \leq \alpha_M+2$.

The thickness T of the thermoplastic liquid crystal polymer film of the present invention is preferably within the range of 10 to 250 μm, i.e., $10 \leq T \leq 250$. It is, however, to be noted that where the metal-clad laminate utilizing the thermoplastic liquid crystal polymer film as an electrically insulating material is used as a flexible printed wiring board, the film thickness of such film is more preferably within the range of 20 to 100 μm and, particularly preferably, within the range of 20 to 50 μm. If the thickness of such film is too small, the rigidity and the strength of the film will decrease to such an extent as to constitute a cause of deformation of the resultant printed circuit board due to the imposed pressure at the time of mounting electronic component parts on such printed wiring board, which deformation eventually leads to undesirable reduction of the positional precision of the wiring. It is to be noted that additives such as, for example, a lubricating agent and/or antioxidant and/or filler materials may be mixed in the composition of the film.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

BEST MODE FOR CARRYING OUT THE INVENTION

Figure 2:
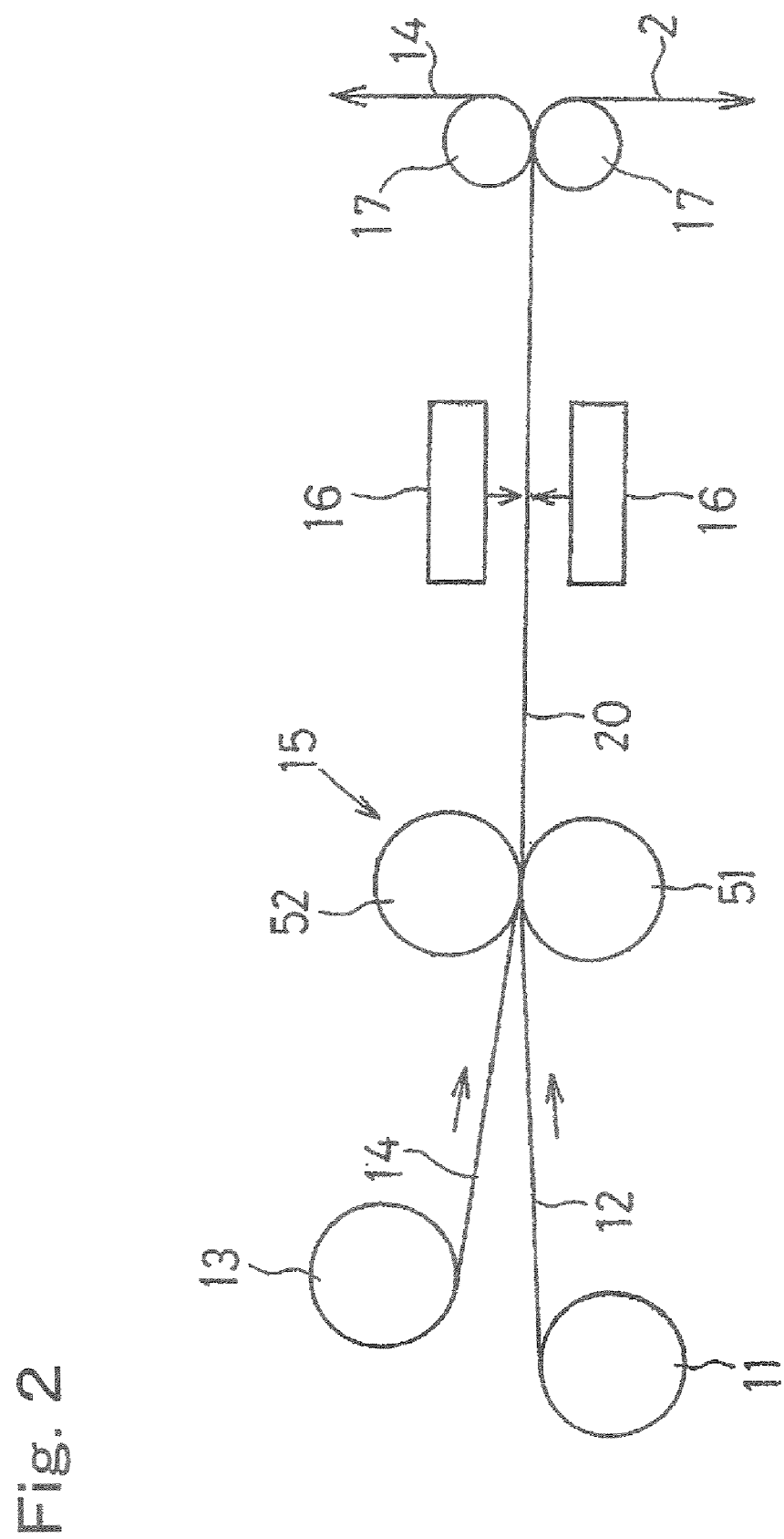
FIG. 2 is a schematic side view showing one example of an apparatus for manufacturing a thermoplastic liquid crystal polymer film that is employed in the metal-clad laminate according to the present invention.

FIG. 2 illustrates an example of an apparatus for manufacturing a thermoplastic liquid crystal polymer film used for a metal-clad laminate of the present invention and which has respective coefficients $\alpha_L$ and $\alpha_T$ of thermal expansion in lengthwise (longitudinal) and widthwise (transverse) directions falling within specific ranges. The illustrated apparatus makes a laminated sheet 20 made up of a thermoplastic liquid crystal polymer film 12, which is drawn outwardly from a supply roll 11, and a support 14 such as, for example, an aluminum foil drawn outwardly from a supply roll 13, the both of which are, while overlapped one above the other, thermally compressed to bond them together as they are supplied to a heating roll assembly 15.

For the heating roll assembly 15, a pair of metallic heating rolls or a combination of a heating roll made of a heat resistant rubber and a metallic heating roll are employed. In the manufacture of the laminated sheet 20 shown in FIG. 2, the combination of the heat-resistant rubber heating roll 51 and the metallic heating roll 52 are employed, with the heat-resistant rubber heating roll 51 and the metallic heating roll 52 positioned on respective sides of the film 12 and the support 14. By this arrangement, unnecessary adhesion of the film to the metallic heating roll 52 can be avoided.

Thereafter, the laminated sheet 20 is supplied to a heat treatment unit 16, where the laminated sheet 20 is heat treated at a temperature within the range of a value lower by 10° C. than the melting point of the thermoplastic liquid crystal polymer film 12 and a value higher by 10° C. than the melting point thereof. When the heat treatment is carried at the temperature within the range of the value 10° C. lower than the melting point of the thermoplastic liquid crystal polymer film 12 and the value 10° C. higher than the melting point thereof, the thermal expansion coefficients of the thermoplastic liquid crystal polymer film 12 can be increased. Then the laminated sheet 20 is subsequently peeled off by two upper and lower peeling rolls 17 and 17, and a thermoplastic liquid crystal polymer film 2 having desired thermal expansion coefficients is provided by separating the thermoplastic liquid crystal polymer film 2 from the support 14. In this way, the thermoplastic liquid crystal polymer film 2 can be obtained, which has the coefficients $\alpha_L$ and $\alpha_T$ of thermal expansion in the lengthwise and widthwise directions, respectively, falling within the specific ranges discussed above. For the heat treatment apparatus 16, any known means such as a hot blast circulating furnace, a hot roll or a ceramic heater can be employed.

Figure 1:
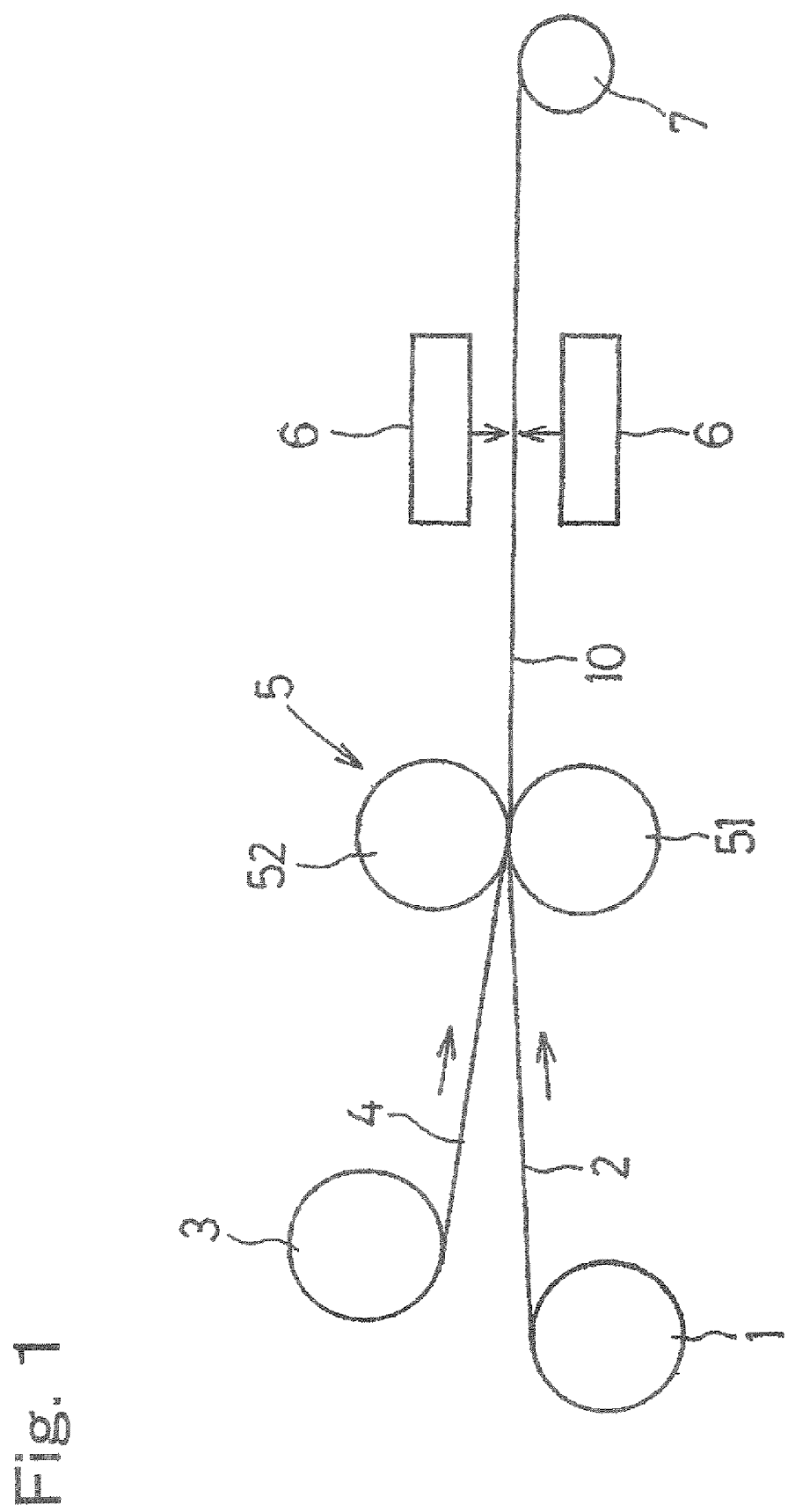
FIG. 1 is a schematic side view showing one example of an apparatus for performing a method of continuously manufacturing a metal-clad laminate according to an embodiment of the present invention.

FIG. 1 illustrates an example of an apparatus for performing the method of continuously manufacturing the metal-clad laminate of the present invention. This apparatus makes a one-side metal-clad laminate 10 made up of the thermoplastic liquid crystal polymer film 2, which has made using the apparatus shown in FIG. 2, and has the coefficients $\alpha_L$ and $\alpha_T$ of thermal expansion in the lengthwise and widthwise directions, respectively, falling within the specific ranges discussed above, and a metallic sheet 4 such as a copper foil. During a first process step of the apparatus the thermoplastic liquid crystal polymer film 2 and the metallic sheet 4 are drawn outwardly from a supply roll 1 and a supply roll 3, respectively, and the both of them are, while overlapped one above the other, thermally compressed to bond them together as they are supplied to a heating roll assembly 5. For this heating roll assembly 5, a pair of metallic heating rolls or a combination of a heating roll made of a heat resistant rubber and a metallic heating roll are employed. In the case of the manufacture of this one-sided metal-clad laminate 10 referred to above, the combination of the heat-resistant rubber heating roll 51 and the metallic heating roll 52 are employed in a manner similar to that described hereinabove.

When during the first process step, the layered product of the polymer film 2 and the metallic sheet 4 are, while a tension is applied thereto in a direction lengthwise of the film, supplied through the heating roll assembly 5 in a fashion, in which the thermoplastic liquid crystal polymer film 2 and the metal sheet 4 are overlapped one above the other, and then thermally compressed to bond them together by a pressure which is applied in a lengthwise direction of the film at a nipping region between heating rolls 51 and 52, the both can be laminated to give a metal-clad laminate 10. At this time, as a result of using the thermoplastic liquid crystal polymer film 2 having the coefficients $\alpha_L$ and $\alpha_T$ of thermal expansion in the lengthwise and widthwise directions, respectively, falling within the specific ranges discussed above, the anisotropy of thermal expansion in the lengthwise direction of the film, which occurs in the thermoplastic liquid crystal polymer film 2, can be counterbalanced with the orientation of molecules of the polymer film 2 in which the molecules are oriented in a direction transverse to the lengthwise direction of the film, when the thermal compression is effected at the nipping region between the heating rolls 51 and 52 while the tension has been applied continuously in the lengthwise direction of the film. In this way, since the anisotropy of the thermal expansion coefficient of the thermoplastic liquid crystal polymer film 2 is removed, the metal-clad laminate 10 excellent in isotropy and appearance can be obtained in a stable manner.

This apparatus then operates to supply the metal-clad laminate 10 obtained during the first process step to a heat treating unit 6, and during a second process step, the metal-clad laminate 10 is heat treated at a heating temperature not higher than the melting point of the thermoplastic liquid crystal polymer film 2. By so doing, the metal-clad laminate 10 can be obtained, which exhibits a high force of bonding between the polymer film 2 and the metallic sheet 4 and an excellent dimensional stability having a desired rate of change in dimension. In order to increase the force of bonding between the polymer film 2 and the metallic sheet 4, the heating temperature is preferably within the range of a value lower by 5° C. than the melting point of the film 2 and a value lower by 20° C. than the melting point thereof. If the heating temperature exceeds the melting point, foaming and/or considerable change in thermal expansion coefficient will occur and the quality of the film may not be developed to a desired extent. On the other hand, if the heating temperature is lower by 20° C. than the melting point, it will not contribute to increase of the force of bonding between the polymer film 2 and the metallic sheet 4 and it may occur that, depending on the type of the metallic sheet 4 to be used, no required bonding force will be satisfied. For the heat treating unit 6, a hot blast circulating furnace, a hot roll or a ceramic heater can be employed in a manner similar to that hereinbefore described. After this second process step, the metal-clad laminate 10 is wound up by and around a winding roll 7 in a roll form.

Hereinafter, the present invention will be described in detail by way of Examples, but the present invention is in no way limited by those Examples. It is to be noted that in the following Examples, the melting point of the thermoplastic liquid crystal polymer film, and bonding strength and dimensional stability of the metal-clad laminate were evaluated in the following manners.

(1) Melting Point

Using a differential scanning calorimeter, the thermal behavior of the film was observed to determine the melting point. In other words, after the temperature of the test film was raised at a rate of 20° C./min to completely melt the film, the molten product was rapidly cooled down to 50° C. at a rate of 50° C./min and, then, the position of the heat absorption peek appearing when the temperature thereof was again raised at a rate of 20° C./min was recorded as the melting point of the film.

(2) Bonding Strength

A test piece having a width of 1.5 cm was prepared from the laminate, and the film layer of the test piece was then fixed to a flat plate by a double-sided bonding tape, and the bonding strength (kg/cm), at which the metallic foil of the test piece separates from the film layer, was measured by peeling the metallic foil from the film layer at a rate of 50 mm/min by the 180° method in accordance with JIS C 5016.

(3) Dimensional Stability of Laminate

The dimensional stability was measured according to IPC-TM-6502.2.4.

REFERENCE EXAMPLE 1

A thermoplastic liquid crystal polymer, which was a copolymer of p-hydroxy benzoic acid and 6-hydroxy-2-naphthoic acid and had a melting point of 280° C. was melt-extruded and was then formed into films, having respective film thicknesses of 25, 50, 100 and 225 μm, by an inflation molding method under a condition in which the ratio of drawing in longitudinal and transverse directions was controlled. Each of those resultant films, after having been overlapped with a respective aluminum foil which had a film thickness of 30 μm and was applied thereon with a mold releasing agent, was thermally compressed to bond to the metallic foil by passing them through a nipping region between a metallic heating roll of 260° C. and a heat resistant rubber roll under a pressure of 20 kg/cm², and was subsequently heat treated for 30 seconds in a heating furnace, which had been heated to a temperature required for the coefficient of thermal expansion $\alpha_L$ of each of those films having the different film thickness in the MD direction to attain the following respective value. Thereafter, each of those laminated films was heat treated for six hours in an oven at 260° C. under the nitrogen atmosphere, followed by peeling off the aluminum foil from the respective film to provide a respective thermoplastic liquid crystal polymer film having a melting point of 305° C., a thermal expansion coefficient $\alpha_T$ of $19 \times 10^{-6}$ cm/cm/° C. in the TD direction and a thermal expansion coefficient $\alpha_L$ of 25.3, 24.5, 23 or 19.3 ($\times 10^{-6}$ cm/cm/° C.) ($\beta = -0.03$ and $\gamma = 26$) in the MD direction. Those thermoplastic liquid crystal polymer films are hereinafter referred to as the thermoplastic liquid crystal polymer film A.

In Reference Example 1 described above, for example, in the case where the thermoplastic liquid crystal polymer film A and the copper foil (metallic sheet) are laminated together, the requirement of ($10 \leq T \leq 250$) is satisfied because the thickness of the film is one of 25, 50, 100 and 225 μm; the requirement of ($-0.08 \leq \beta \leq -0.01$) is satisfied because the thickness coefficient $\beta$ is $-0.03$; and the requirement of ($\alpha_M + 6 \leq \gamma \leq \alpha_M + 10$) is satisfied because the anisotropy coefficient $\gamma$ is 26 and the thermal expansion coefficient $\alpha_M$ of the copper foil is 18 ($\times 10^{-6}$ cm/cm/° C.). Because the thermal expansion coefficient $\alpha_T$ is 19 ($\times 10^{-6}$ cm/cm/° C.) for all the films, the requirement of ($\alpha_M - 2 \leq \alpha_T \leq \alpha_M + 3$) is satisfied. The thermal expansion coefficient $\alpha_L$ matches with the calculated result of ($\beta T+\gamma$) when the thickness T, the thickness coefficient $\beta$ and the anisotropy coefficient $\gamma$ are substituted, i.e., ($\alpha_L=\beta T+\gamma$). Thus, the thermoplastic liquid crystal polymer film A has those parameters falling within the respective ranges that are required in the practice of the present invention.

REFERENCE EXAMPLE 2

A thermoplastic liquid crystal polymer, which was a copolymer of p-hydroxy benzoic acid and 6-hydroxy-2-naphthoic acid and had a melting point of 280° C. was melt-extruded and was then formed into films, having respective film thicknesses of 25, 50, 100 and 225 µm, by an inflation molding method under a condition, in which the ratio of drawing in longitudinal and transverse directions was controlled. Each of those resultant films, after having been overlapped with a respective aluminum foil which had a film thickness of 30 µm and was applied thereon with a mold releasing agent, was thermally compressed to bond to the aluminum foil by passing them through a nipping region between a metallic heating roll of 260° C. and a heat resistant rubber roll under a pressure of 20 kg/cm², and was subsequently heat treated for 30 seconds in a heating furnace, which had been heated to a temperature required for the coefficient of thermal expansion $\alpha_L$ of each of those films of the different film thickness in the MD direction to attain the following respective value. Thereafter, each of those laminated films was heat treated for six hours in an oven at 260° C. under the nitrogen atmosphere, followed by peeling off the aluminum foil from the respective film to provide a respective thermoplastic liquid crystal polymer film having a melting point of 305° C., a thermal expansion coefficient $\alpha_T$ of 19 ($\times 10^{-6}$ cm/cm/° C.) in the TD direction and a thermal expansion coefficient $\alpha_L$ of 23.5, 23, 22 and 19.5 ($\times 10^{-6}$ cm/cm/° C.) ($\beta=-0.02$ and $\gamma=24$) in the MD direction. Those thermoplastic liquid crystal polymer films are hereinafter referred to as the thermoplastic liquid crystal polymer film B.

In Reference Example 2 described above, where the thermoplastic liquid crystal polymer film B and the copper foil (metallic sheet) are laminated together in a manner similar to that in Reference Example 1 above, the requirement of the thickness T is similarly satisfied; the requirement of ($-0.08\leq\beta\leq-0.01$) is satisfied because the thickness coefficient $\beta$ is $-0.02$; and the requirement of ($\alpha_M+6\leq\gamma\leq\alpha_M+10$) is satisfied because the anisotropy coefficient $\gamma$ is 24 and the thermal expansion coefficient $\alpha_M$ of the copper foil is 18 ($\times 10^{-6}$ cm/cm/° C.). Because the thermal expansion coefficient $\alpha_T$ is 19 ($\times 10^{-6}$ cm/cm/° C.) for all the films, the requirement of ($\alpha_M-2\leq\alpha_T\leq\alpha_M+3$) is satisfied. The thermal expansion coefficient $\alpha_L$ matches with the calculated result of ($\beta T+\gamma$) when the thickness T, the thickness coefficient $\beta$ and the anisotropy coefficient $\gamma$ are substituted, i.e., ($\alpha_L=\beta T+\gamma$). Thus, the thermoplastic liquid crystal polymer film B has those parameters falling within the respective ranges that are required in the practice of the present invention.

REFERENCE EXAMPLE 3

A thermoplastic liquid crystal polymer, which was a copolymer of p-hydroxy benzoic acid and 6-hydroxy-2-naphthoic acid and had a melting point of 280° C. was melt-extruded and was then formed into films, having respective film thicknesses of 25, 50, 100 and 225 µm, by an inflation molding method under a condition, in which the ratio of drawing in longitudinal and transverse directions was controlled. Each of those resultant films, after having been overlapped with a respective aluminum foil which had a film thickness of 30 µm and was applied thereon with a mold releasing agent, was thermally compressed to bond to the aluminum foil by passing them through a nipping region between a metallic heating roll of 260° C. and a heat resistant rubber roll under a pressure of 20 kg/cm², and was subsequently heat treated for 30 seconds in a heating furnace, which had been heated to a temperature required for the coefficient of thermal expansion $\alpha_L$ of each of those films of the different film thickness in the MD direction to attain the following respective value. Thereafter, each of those laminated films was heat treated for six hours in an oven at 260° C. under the nitrogen atmosphere, followed by peeling off the aluminum foil from the respective film to provide a respective thermoplastic liquid crystal polymer film having a melting point of 305° C. and thermal expansion coefficients $\alpha_T$ and $\alpha_L$ of 18 ($\times 10^{-6}$ cm/cm/° C.) ($\beta=0$ and $\gamma=18$) in both of the TD and MD directions. Those thermoplastic liquid crystal polymer films are hereinafter referred to as the thermoplastic liquid crystal polymer film C.

In Reference Example 3 described above, where the thermoplastic liquid crystal polymer film C and the copper foil (metallic sheet) are laminated together in a manner similar to that in Reference Example 1, the requirement of the thickness T is similarly satisfied; the requirement of ($-0.08\leq\beta\leq-0.01$) is not satisfied because the thickness coefficient $\beta$ is 0; and the requirement of ($\alpha_M+6\leq\gamma\leq\alpha_M+10$) is not satisfied either because the anisotropy coefficient $\gamma$ is 18 and the thermal expansion coefficient $\alpha_M$ of the copper foil is 18 ($\times 10^{-6}$ cm/cm/° C.). Because the thermal expansion coefficient $\alpha_T$ is 18 ($\times 10^{-6}$ cm/cm/° C.) for all the films, the requirement of ($\alpha_M-2\leq\alpha_T\leq\alpha_M+3$) is satisfied. The thermal expansion coefficient $\alpha_L$ matches with the calculated result of ($\beta T+\gamma$) when the thickness T, the thickness coefficient $\beta$ and the anisotropy coefficient $\gamma$ are substituted, i.e., ($\alpha_L=\beta+\gamma$). Thus, the thermoplastic liquid crystal polymer film C has the thickness coefficient $\beta$ and the anisotropy coefficient $\gamma$, neither of which do not fall within the respective ranges that are required in the practice of the present invention.

REFERENCE EXAMPLE 4

A thermoplastic liquid crystal polymer, which is a copolymer of p-hydroxy benzoic acid and 6-hydroxy-2-naphthoic acid and has a melting point of 280° C. was melt-extruded and was then formed into films, having respective film thicknesses of 25, 50, 100 and 225 µm, by an inflation molding method under a condition, in which the ratio of drawing in longitudinal and transverse directions was controlled. Each of those resultant films, after having been overlapped with a respective aluminum foil which had a film thickness of 30 µm and was applied thereon with a mold releasing agent, was thermally compressed to bond to the aluminum foil by passing them through a nipping region between a metallic heating roll of 260° C. and a heat resistant rubber roll under a pressure of 20 kg/cm², and was subsequently heat treated for 30 seconds in a heating furnace, which had been heated to a temperature required for the coefficient of thermal expansion $\alpha_L$ of each of those films of the different film thickness in the MD direction to attain the following respective value. Thereafter, each of those laminated films was heat treated for six hours in an oven at 260° C. under the nitrogen atmosphere, followed by peeling off the aluminum foil from the respective film to provide a respective thermoplastic liquid crystal polymer film having a melting point of 305° C., a thermal expansion coefficients $\alpha_T$ of 19 ($\times 10^{-6}$ cm/cm/° C.) in the TD direction and a thermal expansion coefficient $\alpha_L$ of 16.5, 15, 12, 4.5 ($\times 10^{-6}$ cm/cm/° C.) ($\beta=-0.06$ and $\gamma=18$) in the MD direction. Those thermoplastic liquid crystal polymer films are hereinafter referred to as the thermoplastic liquid crystal polymer film D.

In Reference Example 4 described above, where the thermoplastic liquid crystal polymer film D and the copper foil (metallic sheet) are laminated together in a manner similar to that in Reference Example 1, the requirement of the thickness T is similarly satisfied; the requirement of $(-0.08 \leq \beta \leq -0.01)$ is satisfied because the thickness coefficient $\beta$ is $-0.06$; and the requirement of $(\alpha_M + 6 \leq \gamma \leq \alpha_M + 10)$ is not satisfied because the anisotropy coefficient $\gamma$ is 18 and the thermal expansion coefficient $\alpha_M$ of the copper foil is 18 ($\times 10^{-6}$ cm/cm/° C.). Because the thermal expansion coefficient $\alpha_T$ is 19 ($\times 10^{-6}$ cm/cm/° C.) for all of the films, the requirement of $(\alpha_M - 2 \leq \alpha_T \leq \alpha_M + 3)$ is satisfied. The thermal expansion coefficient $\alpha_L$ matches with the calculated result of $(\beta T + \gamma)$ when the thickness T, the thickness coefficient $\beta$ and the anisotropy coefficient $\gamma$ are similarly substituted, i.e., $(\alpha_L = \beta T + \gamma)$. Thus, the thermoplastic liquid crystal polymer film D has the anisotropy coefficient $\gamma$ which do not fall within the ranges that is required in the practice of the present invention.

EXAMPLE 1

The thermoplastic liquid crystal polymer film A obtained in the Reference Example 1 and an electrolytic copper foil having a thickness of 18 μm and a thermal expansion coefficient of 18 ($\times 10^{-6}$ cm/cm/° C.) were used. In a continuous hot roll press apparatus, were installed a heating roll made of a heat resistant rubber (90 degree in hardness) and a metallic heating roll. While the tension in the free run region, through which the thermoplastic liquid crystal polymer film A and the copper foil were introduced to a nipping region between the heating rolls, was adjusted to 2 kg for a 400 mm width, the thermoplastic liquid crystal polymer film A and the copper foil were fed to the nipping region of the heating rolls to allow them to be thermally compressed at 300° C. under a pressure of 20 kg/cm² to thereby provide a laminate of the thermoplastic liquid crystal polymer film and the electrolytic copper foil. Thereafter, the laminate so obtained was heat treated for 30 seconds under the nitrogen atmosphere in an oven heated to 270° C. Results of tests conducted on the resultant laminate to determine the bonding strength and the dimensional stability are tabulated in Table 6 below. As shown in Table 6, the metal-clad laminate excellent in bonding strength and dimensional stability was obtained.

EXAMPLE 2

In place of the film A, using the thermoplastic liquid crystal polymer film B obtained in Reference Example 2, a similar laminate was prepared and was tested as to the bonding strength and the dimensional stability. Results of the test are tabulated in Table 6 below. As shown in Table 6, the metal-clad laminate excellent in bonding strength and dimensional stability was obtained.

COMPARATIVE EXAMPLE 1

A metal-clad laminate similar to Example 1, but in which the thermoplastic liquid crystal polymer film C obtained in Reference Example 3 was employed instead of the thermoplastic liquid crystal polymer film A, was prepared and tested as to the bonding strength and the dimensional stability. Results of the tests are tabulated in Table 6 below. As shown in Table 6, the dimensional stability of this metal-clad laminate in the MD direction is unsatisfactory.

COMPARATIVE EXAMPLE 2

A metal-clad laminate similar to Example 1, but in which the thermoplastic liquid crystal polymer film D obtained in Reference Example 4 was employed instead of the thermoplastic liquid crystal polymer film A, was prepared and tested as to the bonding strength and the dimensional stability. Results of the tests are tabulated in Table 6 below. As shown in Table 6, the dimensional stability of this metal-clad laminate in the MD direction is unsatisfactory.

COMPARATIVE EXAMPLE 3

The thermoplastic liquid crystal polymer film A obtained in the Reference Example 1 and an electrolytic copper foil having a thickness of 18 μm and a thermal expansion coefficient of 18 ($\times 10^{-6}$ cm/cm/° C.) were used. In a continuous hot roll press apparatus, were installed a heating roll made of a heat resistant rubber (90 degree in hardness) and a metallic heating roll. While the tension in the free run region, through which the thermoplastic liquid crystal polymer film A and the copper foil were introduced to a nipping region between the heating rolls, was adjusted to 2 kg for a 400 mm width, the thermoplastic liquid crystal polymer film A and the copper foil were fed to the nipping region of the heating rolls to allow them to be thermally compressed at 300° C. under a pressure of 20 kg/cm² to thereby provide a laminate of the thermoplastic liquid crystal polymer film and the electrolytic copper foil. Results of tests conducted on the resultant laminate to determine the bonding strength and the dimensional stability are tabulated in Table 6 below. As shown in Table 6, the metal-clad laminate has exhibited an unsatisfactory bonding strength because the process employed to prepare the laminate for this Comparative Example did not include the second process step employed in the practice of the present invention.

TABLE 6

| | Thickness Coefficient $\beta$ | Anisotropy Coefficient $\gamma$ | Bonding Strength (kg/cm) | Dimensional Stability (%) MD Direction | TD Direction |
|---|---|---|---|---|---|
| Ex. 1 | −0.03 | 26 | 1.2 | −0.01 | +0.01 |
| Ex. 2 | −0.02 | 24 | 1.3 | +0.01 | +0.01 |
| Com. Ex. 1 | 0 | 18 | 1.0 | +0.25 | +0.01 |
| Com. Ex. 2 | −0.06 | 18 | 1.2 | +0.20 | +0.01 |
| Com. Ex. 3 | −0.03 | 26 | 0.7 | −0.01 | +0.01 |

What is claimed is:

1. A method for producing a metal-clad laminate, comprising:
   a thermoplastic liquid crystal polymer film (A) having a thermoplastic liquid crystal polymer capable of forming an optically anisotropic melt phase; and
   a metallic sheet bonded to at least one surface of the film;
   wherein the method comprises:
   preparing the thermoplastic liquid crystal polymer film (A) having a melting point;
   thermally compressing the metallic sheet and the thermoplastic liquid crystal polymer film (A) at a nipping region between heating rolls to bond them together to obtain a metal-clad laminate; and heat treating the obtained metal-clad laminate at a heat treating temperature in a range from 5° C. to 20° C. lower than the melting point of the thermoplastic liquid crystal polymer film (A);

wherein preparing the thermoplastic liquid crystal polymer film (A) comprises:

laminating a support and a thermoplastic liquid crystal polymer film (B) having thermal and mechanical properties along a mechanical and a transverse axis;

thermally compressing the support and the thermoplastic liquid crystal polymer film (B) to obtain a laminated sheet;

heating the laminated sheet at a temperature in a range of from 10° C. lower than a melting point of the thermoplastic liquid crystal polymer film (B) to 10° C. higher than the melting point of the thermoplastic liquid crystal polymer film (B) to obtain a coefficient of thermal expansion in the longitudinal direction ($\alpha L$), and a coefficient of thermal expansion in the transverse direction ($\alpha T$) of the thermoplastic liquid crystal polymer film (A); and peeling off the support from the heated laminated sheet to obtain the thermoplastic liquid crystal polymer film (A);

wherein the thermoplastic liquid crystal polymer film (A) has the obtained coefficient of thermal expansion in the longitudinal direction ($\alpha L$), the obtained coefficient of thermal expansion in the transverse direction ($\alpha T$), a thickness (T), a thickness coefficient ($\beta$) and an anisotropy coefficient ($\gamma$) which satisfy the formula, $$\alpha L = \beta T + \gamma,$$

and wherein the thickness coefficient $\beta$ of the thermoplastic liquid crystal polymer film (A) is within the range of $-0.08(\times 1/(\mu m \times °C.))$ to $-0.01(\times 1/(\mu m \times °C.))$, the anisotropy coefficient $\gamma$ of the thermoplastic liquid crystal polymer film (A) relative to a thermal expansion coefficient ($\alpha M$) of the metallic sheet is within the range of $(\alpha M +6)(10^{-6}/°C.) \leq \gamma \leq (\alpha M+10)(10^{-6}/°C.)$, and the coefficient of thermal expansion in the transverse direction ($\alpha T$) of the thermoplastic liquid crystal polymer film (A) relative to the thermal expansion coefficient $\alpha M$ of the metallic sheet is within the range of $(\alpha M-2)(10^{-6}/°C.) \leq \alpha T \leq (\alpha M +3)(10^{-6}/°C.)$.

2. The method according to claim 1, wherein the thickness (T) of the thermoplastic liquid crystal polymer film is within the range of from 10 to 250 μm.

3. The method according to claim 1, wherein a metallic sheet is bonded to both surfaces of the thermoplastic liquid crystal polymer film (A).

4. The method according to claim 1 wherein a melting point of the thermoplastic liquid crystal polymer is from about 200 about 400 ° C.

* * * * *